United States Patent
Yang

(10) Patent No.: US 7,288,810 B2
(45) Date of Patent: Oct. 30, 2007

(54) NONVOLATILE SEMICONDUCTOR MEMORY DEVICE HAVING DOUBLE FLOATING GATE STRUCTURE AND METHOD OF MANUFACTURING THE SAME

(75) Inventor: Jeong-hwan Yang, Suwon-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 245 days.

(21) Appl. No.: 10/913,489

(22) Filed: Aug. 9, 2004

(65) Prior Publication Data
US 2005/0063215 A1    Mar. 24, 2005

(30) Foreign Application Priority Data
Aug. 7, 2003    (KR) .................. 10-2003-0054782

(51) Int. Cl.
*H01L 29/788* (2006.01)
(52) U.S. Cl. ....................... 257/315; 257/321
(58) Field of Classification Search ............... 257/315, 257/314, 321
See application file for complete search history.

(56) References Cited

U.S. PATENT DOCUMENTS

| | | | |
|---|---|---|---|
| 4,380,057 A * | 4/1983 | Kotecha et al. | 365/184 |
| 5,045,488 A | 9/1991 | Yeh | |
| 5,973,356 A | 10/1999 | Noble et al. | |
| 6,329,685 B1 | 12/2001 | Lee | |
| 6,744,094 B2 * | 6/2004 | Forbes | 257/315 |
| 6,768,158 B2 * | 7/2004 | Lee et al. | 257/315 |
| 2003/0042531 A1 | 3/2003 | Lee et al. | |

OTHER PUBLICATIONS

European Search Report, dated Mar. 23, 2005.

* cited by examiner

*Primary Examiner*—Tuan T. Nguyen
*Assistant Examiner*—Allison P Bernstein
(74) *Attorney, Agent, or Firm*—Harness, Dickey & Pierce, P.L.C.

(57) ABSTRACT

The nonvolatile semiconductor memory device includes a non-planar active region with floating gates disposed on opposite sides of the active region. A control gate overlaps the floating gates and a portion of the active region.

10 Claims, 24 Drawing Sheets

NONVOLATILE SEMICONDUCTOR MEMORY DEVICE HAVING DOUBLE FLOATING GATE STRUCTURE AND METHOD OF MANUFACTURING THE SAME

This application claims priority to Korean Patent Application No. 2003-54782, filed on Aug. 7, 2003, in the Korean Intellectual Property Office, the contents of which are incorporated herein by reference in its entirety.

BACKGROUND OF THE INVENTION

1. Field of the Invention

The present invention relates to a semiconductor memory device and a method of manufacturing the same. More particularly, the present invention relates to a non-planar split-gate-type nonvolatile semiconductor memory device and a method of manufacturing the same.

2. Description of the Related Art

In recent years, electrically erasable and programmable read only memory (EEPROM) or flash memory devices have become strongly relied upon. A flash memory, widely used nowadays, can be electrically erased and programmed, and retains data even if the supply of power is interrupted.

In a nonvolatile semiconductor memory device, memory cells are connected to a bit line parallel to each other. If the threshold voltage of a memory cell transistor becomes lower than a voltage (normally, 0 V) applied to a control gate of a non-selection memory cell, current flows between a source region and a drain region irrespective of whether a selection memory cell is turned on or off. As a result, all the memory cells are read as if they are continuously in a turn-on state. For this reason, it is necessary to strictly control the threshold voltage in the nonvolatile memory device, which is very difficult. Also, high-speed programming of memory cells necessitates generation of sufficient channel hot carriers, and high-speed erasing thereof requires generation of sufficient Fowler-Nordheim (F-N) tunneling currents. To generate sufficient channel hot carriers or sufficient F-N tunneling currents, a high voltage is indispensable.

To solve these problems, split-gate-type nonvolatile semiconductor memory devices (e.g., as disclosed in U.S. Pat. No. 5,045,488) have been proposed. In these conventional split-gate-type nonvolatile semiconductor memory devices, a channel region formed by a floating gate and another channel region formed by a control gate are connected in series on the same plane.

Also, with the increased integration density of semiconductor memory devices, various structures and manufacturing processes of semiconductor devices (e.g., as disclosed in U.S. Pat. No. 6,329,685) have been proposed to minimize alignment errors between components such as sources, drains, control gates, and floating gates.

Meanwhile, in recent field effect transistor (FET) techniques, devices are scaled down, thereby achieving high efficiency and thus improving the operating speed. As the channel length of an FET has been scaled down on the level of 100 nm or less, it is very difficult to sufficiently reduce the gate length of the FET by scaling. However, the conventional split-gate-type nonvolatile memory device has a planar channel structure. In this planar FET, the gate length can be scaled along with the scaling of a transistor. However, while the distance between a source region and a drain region decreases, it is difficult to sufficiently scale a tunneling oxide layer.

Thus, adverse coupling occurs between channel regions and the source region or the drain region. This lowers the controllability of a gate for turning on and off a semiconductor device, and leads to a short channel effect (SCE) and drain induced barrier lowering. Therefore, in the conventional planar nonvolatile semiconductor memory devices, the SCE cannot be properly controlled by scaling.

A split-gate-type flash memory device has a floating gate which is separated from a control gate and electrically isolated from the outside. Data storage is enabled by using a variation of current level in memory cells through injection of electrons into the floating gate (i.e., programming) and emission of the electrons from the floating gate (i.e., erasing). The injection of electrons into the floating gate is performed using channel hot electron injection (CHEI), whereas the emission of electrons from the floating gate is performed by F-N tunneling mechanism using an insulating layer between the floating gate and a control gate. Nowadays, attempts are being made to increase the erasing efficiency by forming tips at edge portions of the floating gate, adjacent to the control gate. However, in the conventional nonvolatile semiconductor memory devices, the number of corners of the floating gate where the tips can be formed is too low to improve the erasing efficiency.

SUMMARY OF THE INVENTION

The present invention provides a nonvolatile semiconductor memory device. In one example embodiment, the device is structured such that the short channel effect (SCE) is easily controlled to improve the scaling effect. For example, in this embodiment, the active region is a non-planar silicon structure with floating gates disposed on opposite sides of the active region. In another example embodiment, the device is structured such that the number of corners of a floating gate, where tips may be formed is increased. For example, in this embodiment, a control gate overlaps at least three corners of each floating gate.

As will be appreciated, the present invention may also provide a non-planar full depletion mode nonvolatile semiconductor memory device having a double-floating gate channel. Even though the distance between a source region and a drain region decreases due to scaling, the device of the present invention facilitates the control of a gate by increasing coupling between a channel and a floating gate, while reducing adverse coupling between the channel and the source or the drain.

The present invention may further provide a method of manufacturing a nonvolatile semiconductor memory device. At least one embodiment of this method enhances the scaling effect and improves the current characteristics of cells by increasing the effective channel width per cell.

BRIEF DESCRIPTION OF THE DRAWINGS

The above and other features and advantages of the present invention will become more apparent by describing in detail exemplary embodiments thereof with reference to the attached drawings in which:

FIGS. 4A through 16A are sectional views taken along line 4A-4A' of FIG. 3, illustrating process steps of a method of manufacturing the nonvolatile semiconductor memory device shown in FIG. 1;

FIGS. 4B through 15B are plan views of FIGS. 4A through 15A, respectively;

FIGS. 4C through 15C are partial sectional views of FIGS. 4B through 15B, respectively;

FIGS. 8D through 14D and 14E are partial sectional views of FIGS. 8B through 14B, respectively.

DETAILED DESCRIPTION OF THE INVENTION

Figure 1:
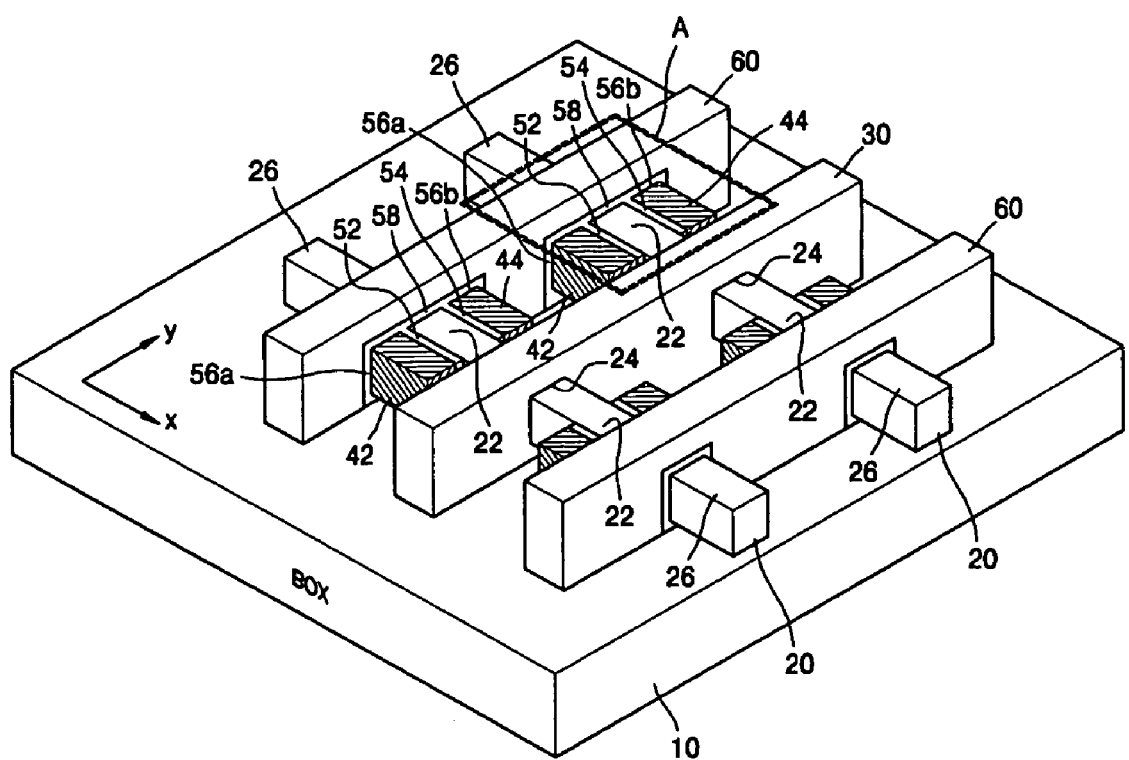
FIG. 1 is a perspective view of a nonvolatile semiconductor memory device according to an embodiment of the present invention.

The present invention will now be described more fully with reference to the accompanying drawings, in which exemplary embodiments of the invention are shown. This invention may, however, be embodied in different forms and should not be construed as being limited to the embodiments set forth herein. Rather, these embodiments are provided so that this disclosure will be thorough and complete, and will fully convey the scope of the invention to those skilled in the art. In the drawings, the size or thickness of layers and regions are exaggerated for clarity.

FIG. 1 illustrates a perspective view of a nonvolatile semiconductor memory device according to an embodiment of the present invention. Specifically, FIG. 1 illustrates a 4-bit memory cell, in which one bit is comprised of a portion denoted by reference character "A".

As shown in FIG. 1, the nonvolatile semiconductor memory device of the present invention is formed on a buried oxide layer (BOX) 10 disposed on a silicon on insulator (SOI) substrate. The SOI substrate is made of a substrate formed by, for example, separation by implantation of oxygen (SIMOX), and the BOX 10 has a thickness of, for example, about 1000 Å to 1500 Å. The nonvolatile semiconductor memory device of the present invention comprises active regions, each of which includes a silicon island 20 obtained by patterning an SOI layer of the SOI substrate. The silicon island 20 has a thickness of about 500 Å and extends in an x direction on the BOX 10 in the shape of a roughly square sectional bar. The silicon island 20 has a top surface that extends parallel to a main surface of the SOI substrate (i.e., the BOX 10) and two sidewalls that extend perpendicular to the main surface of the SOI substrate (i.e., the BOX 10).

A channel region 22 is formed inside the silicon island 20 and extends in the x direction. A source line 30 is formed on a source 24 disposed inside the silicon island 20, adjacent to the channel region 22, and extends perpendicular to the lengthwise direction (i.e., the x direction) of the silicon island 20 (i.e., extends in a y direction). Also, a bit line that extends in the x direction is connected to a drain 26 disposed adjacent the channel region 22. For example, if the memory cell is an NMOS device, the silicon island 20 is doped with p-type impurity ions, and the source 24 and the drain 26 are doped with high-concentration n-type impurity ions.

A pair of floating gates, i.e., a first floating gate 42 and a second floating gate 44, which face each other with the silicon island 20 therebetween, are disposed adjacent to the channel region 22 of the silicon island 20. A first coupling gate insulating layer 52 is interposed between the channel region 22 and the first floating gate 42, and a second coupling gate insulating layer 54 is interposed between the channel region 22 and the second floating gate 44. The first floating gate 42 is electrically isolated from the second floating gate 44.

A word line 60 covers the channel region 22 adjacent to the first floating gate 42 or the second floating gate 44 and extends in the y direction. A first interpoly tunneling insulating layer 56a is interposed between the first floating gate 42 and the word line 60, and a second interpoly tunneling insulating layer 56b is interposed between the second floating gate 44 and the word line 60. Also, an insulating layer 58 is interposed between the channel region 22 and the word line 60. That is, the word line 60 includes a portion that faces the channel region 22 with the insulating layer 58 therebetween. A single memory cell, i.e., the portion A is defined only by a contact point between a single bit line, which are connected to the drain 26, and a single word line.

The nonvolatile semiconductor memory device of the present invention comprises a plurality of memory cells as shown in FIG. 1, each of which includes a pair of floating gates, i.e., the first floating gate 42 and the second floating gate 44. Thus, when voltages are applied to the word line 60 and the source 24, a pair of channel are formed along both sidewalls of the channel region 22 perpendicular to the main surface of the SOI substrate, in the channel region 22 adjacent to the first and second coupling gate insulating layer 52 and 54. That is, a non-planar structure, in which the two channels are formed perpendicular to the top surface of the SOI substrate, is provided.

Figure 2:
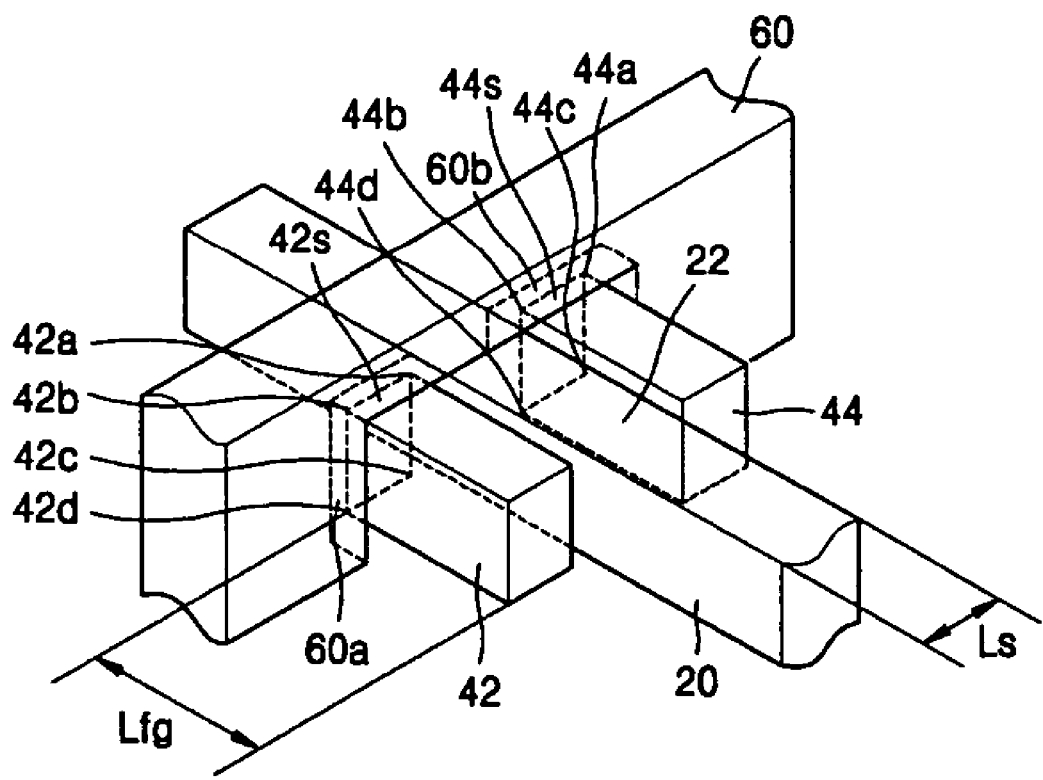
FIG. 2 is a perspective view of an enlarged memory cell of the nonvolatile semiconductor memory device shown in FIG. 1.

FIG. 2 is an enlarged perspective view of one memory cell, i.e., the portion "A" of FIG. 1, showing the channel region 22, the first floating gate 42, the second floating gate 44, and the word line 60.

As shown in FIG. 2, the word line 60 may be formed to surround corners 42a, 42b, 42c, and 42d of the first floating gate 42 and corners 44a, 44b, 44c, and 44d of the second floating gate 44 around the channel region 22. The first floating gate 42 and the second floating gate 44 have a first overlap portion 42s and a second overlap portion 44s, respectively, which overlap the word line 60.

To facilitate understanding, although the first floating gate 42 and the second floating gate 44, shown in FIG. 2, each have four corners that are surrounded by the word line 60 at the first overlap portion 42s and the second overlap portion 44s, the present invention is not limited thereto. In the present invention, the first floating gate 42 and the second floating gate 44 each may have at least three corners that are surrounded by the word line 60 at the first overlap portion 42s and the second overlap portion 44s.

The word line 60 includes recessed surfaces 60a and 60b, which are respectively recessed for the word line 60 so as to surround the first overlap portion 42s and the second overlap portion 44s. The first interpoly tunneling insulating layer 56a is interposed between the word line 60 and the first overlap portion 42s to surround the corners 42a, 42b, 42c, and 42d of the first floating gate 42, and the second interpoly tunneling insulating layer 56b is interposed between the word line 60 and the second overlap portion 44s to surround the corners 44a, 44b, 44c, and 44d of the second floating gate 44. Also, the insulating layer 58 is formed between the first overlap portion 42s and the second overlap portion 44s on the channel region 22.

As described above, the nonvolatile memory device of the present invention comprises two floating gates for a single memory cell, and a control gate formed of the word line 60. Accordingly, a split-gate-type nonvolatile semiconductor memory device having double floating gates in a single memory cell is provided.

Typically, it is reported that the thickness of a silicon body where a channel is formed should be about 1/3 the gate length of the silicon body to form a full depletion mode transistor (IEDM Tech. Digest, pp. 621-624, 2001, by R. Chau et al.). The nonvolatile semiconductor memory device of the present invention has a double-floating gate structure, in which a single memory cell includes two floating gates. Accordingly, considering the thickness of the silicon island 20 that is controlled by each of the first and second floating gates 42 and 44, the width $L_s$ of the top surface of the silicon island 20 formed of the SOI layer may be set about 2/3 the x-directional length $L_{fg}$ of each of the first and second floating gates 42 and 44.

Figure 3:
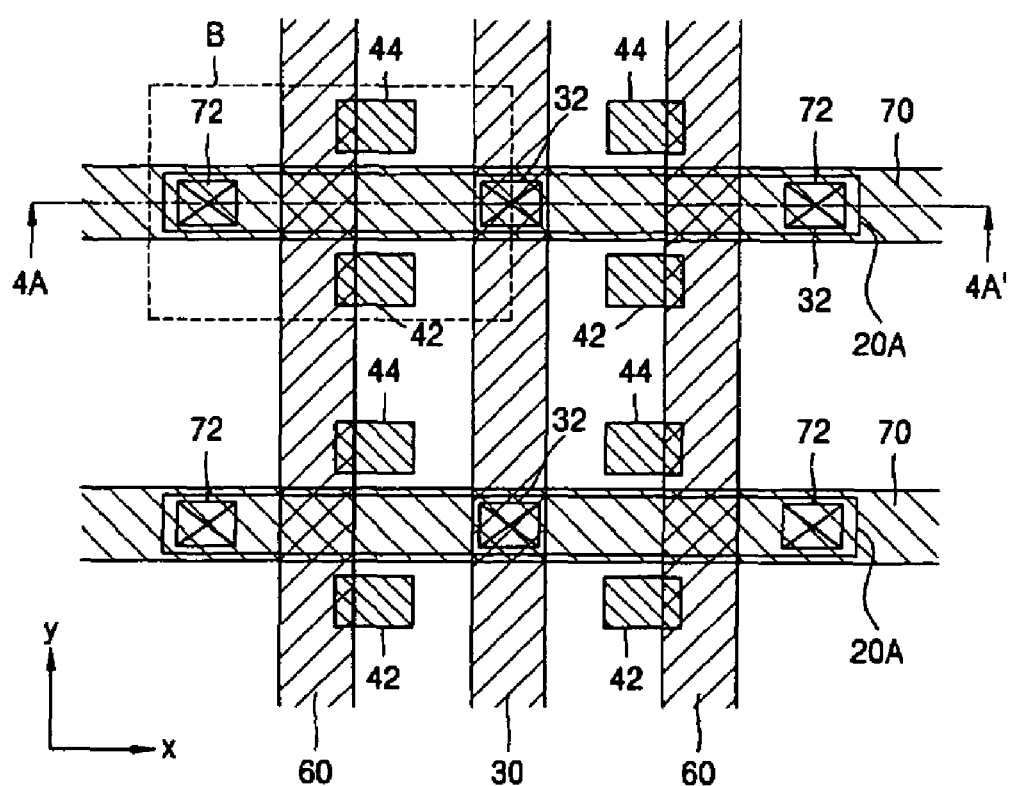
FIG. 3 is a layout of the nonvolatile semiconductor memory shown in FIG. 1.

FIG. 3 is a layout of the nonvolatile semiconductor memory device shown in FIG. 1.

Referring to FIG. 3, reference numeral 20A denotes an active region defined by the silicon island 20, 32 denotes a contact between the source 24 formed in the active region 20A and the source line 30, and 72 denotes a contact between the drain 26 formed in the active region 20A and a bit line 70. In FIG. 3, a portion B denotes a single memory cell corresponding to the portion A in FIG. 1.

The nonvolatile semiconductor memory device of the present invention comprises a plurality of island-shaped active regions 20A, which are formed on a BOX 10 disposed on a substrate and each of which includes two memory cells. The two memory cell have one source 24, i.e., one source line 30, in common inside one active region 20A.

The word line 60 is connected to a series of memory cells, which respectively include a series of channel regions 22 disposed in the lengthwise direction of the word line 60, i.e., in the y direction, among channel regions 22 that are respectively formed in the plurality of active regions 20A. Also, a series of sources 24, which are formed inside a series of active regions 20A disposed in the lengthwise direction of the word line 60, i.e., in the y direction, are connected to each other via the source line 30.

The first floating gate 42 and the second floating gate 44 each are formed of doped polysilicon or metal. Also, the word line 60 and the source line 30 each are formed of doped polysilicon or metal and at least one of them may include a metal silicide layer. The metal silicide layer may be formed of, for example, cobalt silicide, nickel silicide, titanium silicide, hafnium silicide, platinum silicide, or tungsten silicide.

Hereinafter, the operation of the nonvolatile semiconductor memory device of the present invention will be described in detail.

To begin with, the programming of memory cells is performed using a CHEI method. For example, when the memory cell is in an UV-erased initial state, if a high voltage is applied to the word line 60 of the memory cell and a high voltage is applied to the source 24 via the source line 30, two electron channels are formed on both sidewalls of the silicon island 20, which face the first and second floating gates 42 and 44, respectively, due to the threshold voltage Vth applied to the word line 60. Thus, electrons generated in the drain 26 flow into the source 24 via the two channels. Concurrently, channel hot carriers are generated to allow hot electrons to flow through the first and second coupling gate insulating layers 52 and 54 into the first and second floating gates 42 and 44. Thus, the first and second floating gates 42 and 44 are charged with negative charges.

After the programming, the first and second floating gates 42 and 44 each are charged to induce a negative voltage. Thus, the channels, which are formed on the both sidewalls of the silicon island 20 that face the first and second floating gates 42 and 44, respectively, have an increased threshold voltage Vth, which differs from a voltage in the erased state.

The erasing of the memory cell is performed using F-N tunneling, which involves the first and second interpoly tunneling insulating layers 56a and 56b between the first and second floating gates 42 and 44 and the control gate comprised of the word line 60. To erase data, a high voltage is applied to the word line 60 and a low voltage is applied to the source 24. Then, a strong electric field is induced in portions surrounding the overlap portions 42s and 44s of the first and second floating gates 42 and 44 of the word line 60, i.e., adjacent to the recessed surfaces 60a and 60b, due to the corners 42a, 42b, 42c, and 42d of the first floating gate 42 and the corners 44a, 44b, 44c, and 44d of the second floating gate 44. The strong electric field, which concentrates in the corners 42a, 42b, 42c, 42d, 44a, 44b, 44c, and 44d of the first and second floating gates 42 and 44, is sufficiently capable of tunneling the electrons stored in the first and second floating gates 42 and 44 into the word line 60.

If the electrons are emitted from the first and second floating gates 42 and 44 and flow into the word line 60 by the erasing operation, the first and second floating gates 42 and 44 are placed in an initial state, i.e., an UV-erased state. Then, the channels formed on both sidewalls of the channel region 22 that face the first and second floating gates 42 and 44 have a lower threshold voltage than that when the programming is completed, thus allowing a relatively large current to flow during the reading operation.

As described above, the nonvolatile semiconductor memory device of the present invention is a non-planar split-gate-type device, which is formed on the SOI substrate, and each memory cell includes two floating gates 42 and 44 which are adjacent to both sidewalls of the active region, i.e., the silicon island 20. Thus, each of the floating gates 42 and 44 has at least three corners, into which the electric field can concentrate adjacent to the word line 60. That is, a total of six or more corners of the floating gates 42 and 44 are adjacent to the word line 60. Therefore, the number of F-N tunneling regions increases.

Also, in each double-floating gate memory cell including the first floating gate 42 and the second floating gate 44, both sidewalls of the active region 20 serve as the channels so as to increase the effective channel width for each cell in the layout. As a result, a large current can be held in the memory cell.

FIGS. 4A, 4B, and 4C through 16A and 16B illustrate process steps of a method of manufacturing the nonvolatile semiconductor memory device shown in FIG. 1. Specifically, FIGS. 4A through 16A are sectional views taken along line 4A-4A' of FIG. 3, and FIGS. 4B through 15B are plan views of FIGS. 4A through 15A, respectively. FIGS. 4C through 15C are partial sectional views of FIGS. 4B through 15B, respectively, and FIGS. 8D through 14D and 14E are partial sectional views of FIGS. 8B through 14B, respectively. Also, FIG. 16B is a partial sectional view of FIG. 16A.

Figure 4A:
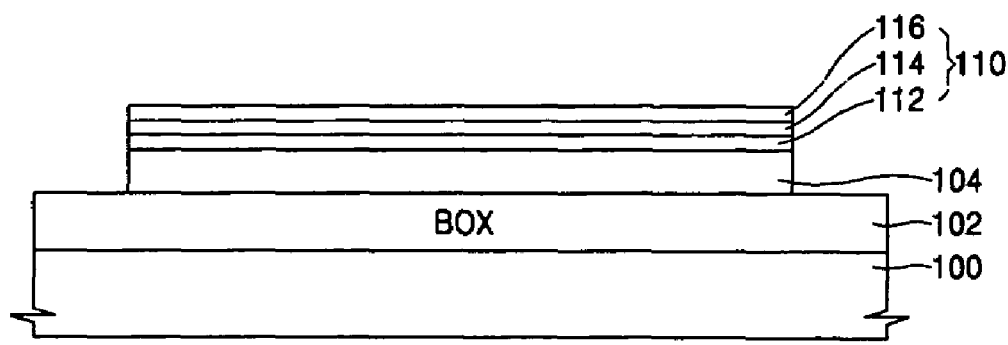
Figure 4B:
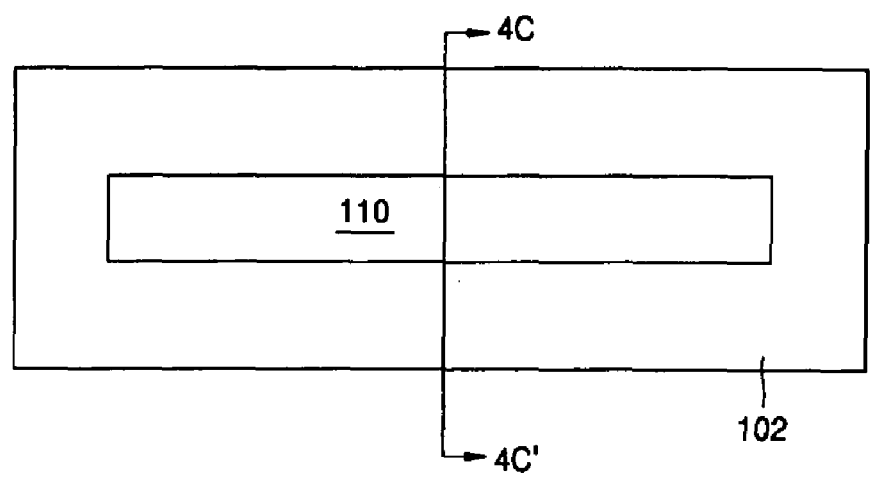

Referring to FIGS. 4A and 4B, an SOI substrate where a silicon substrate 100, a BOX 102, and an SOI layer are sequentially stacked is prepared. The SOI substrate may be formed by, for example, an SIMOX process. For example, the BOX 102 has a thickness of about 1000 Å to 1500 Å, and the SOI layer has a thickness of about 500 Å. A mask pattern 110 is formed on the SOI layer to define an active region. The mask pattern 110 is formed of an oxide layer 112, a nitride layer 114, and another oxide layer 116, which are sequentially stacked. The oxide layer 112, the nitride layer 114, and the oxide layer 116 have a thickness of 200 Å, 300

Å, and 200 Å, respectively. The SOI layer is anisotropically etched using the mask pattern 110 as an etch mask to form a silicon island 104. The silicon island 104 extends in a first direction, i.e., in the x direction shown in FIG. 1, in the shape of a substantially square sectional bar.

Figure 4C:
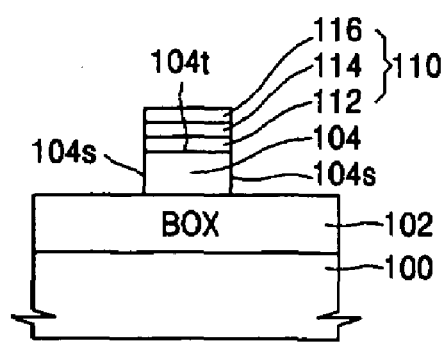

As shown in FIG. 4C, a sectional view taken along line 4C-4C' of FIG. 4B, the silicon island 104 has a top surface 104t, which extends parallel to a main surface of the BOX 102, and both sidewalls 104s extend from the BOX 102 perpendicular to the main surface of the BOX 102.

Figure 5A:
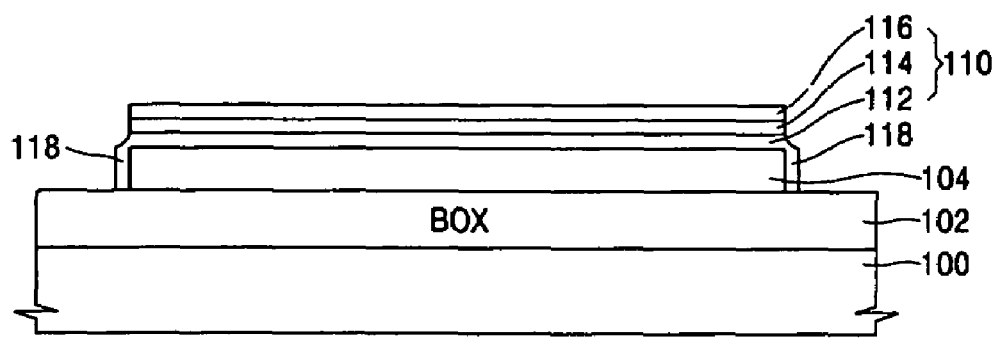
Figure 5B:
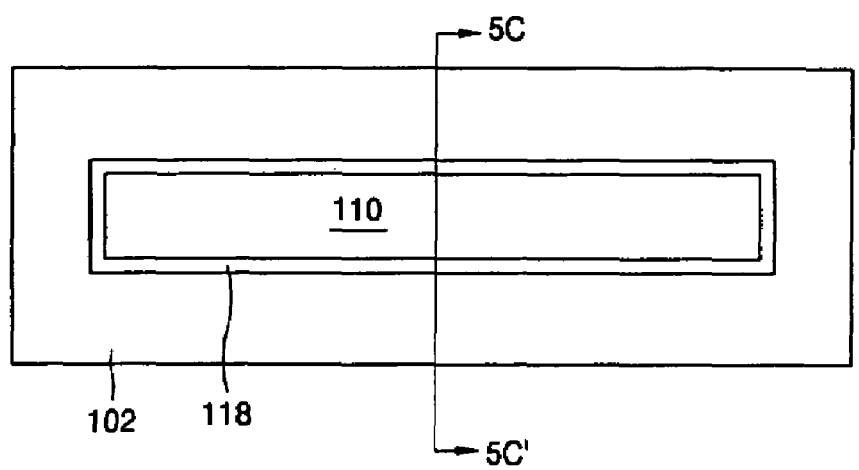
Figure 5C:
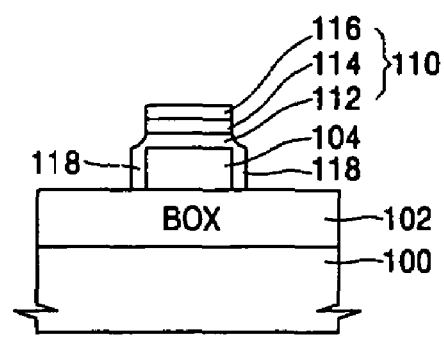

Referring to FIGS. 5A, 5B, and 5C, which is a sectional view taken along line 5C-5C' of FIG. 5B, the exposed both sidewalls 104s of the silicon island 104 are covered with a first oxide layer 118 having a thickness of about 70 Å. A portion of the first oxide layer 118 will constitute a coupling gate insulating layer later. The first oxide layer 118 may be formed using thermal oxidation, chemical vapor deposition (CVD), or a combination thereof.

Thereafter, channel ion implantation is performed to dope the silicon island 104 with impurity ions of a first conductivity type, e.g., p-type impurity ions.

Figure 6A:
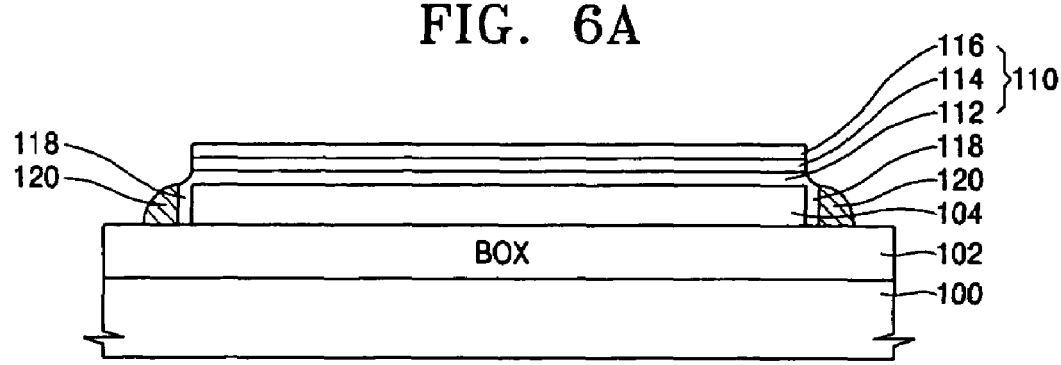
Figure 6B:
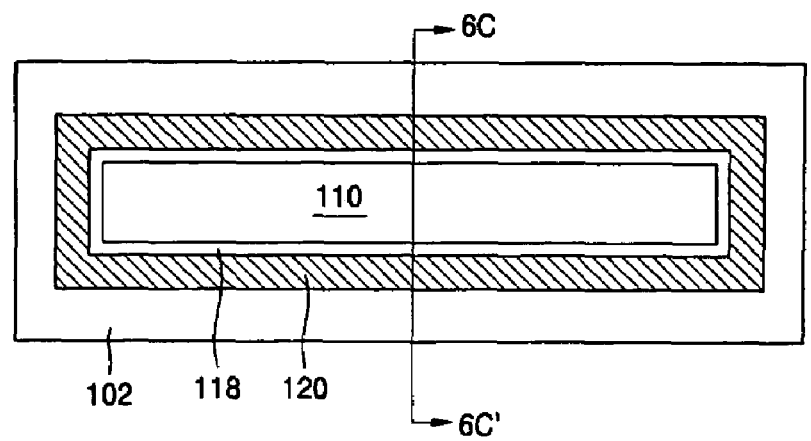
Figure 6C:
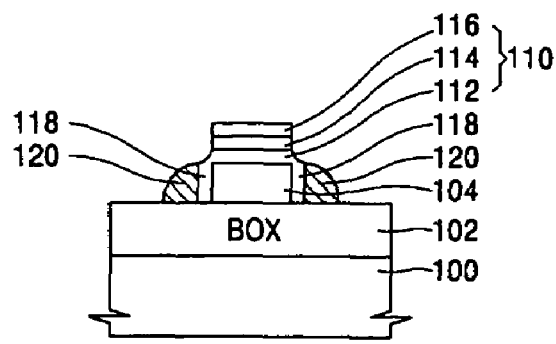

Referring to FIGS. 6A, 6B, and 6C, which is a sectional view taken along line 6C-6C' of FIG. 6B, a blanket conductive layer is formed to a thickness of about 400 Å on the BOX 102 to cover the mask pattern 110 and the first oxide layer 118. Then, the blanket conductive layer is anisotropically etched using the mask pattern 110 and the BOX 102 as an etch stop layer to form a first conductive layer 120. The first conductive layer 120 faces the sidewalls 104s of the silicon island 104 on the first oxide layer 118, and surrounds the silicon island 104 in the shape of a spacer sidewall. In the present invention, it is described that the blanket conductive layer is anisotropically etched to form the first conductive layer 120, but the present invention is not limited thereto. Although not shown in the drawings, the first conductive layer 120 may be formed using other methods, for example, by processing the blanket conductive layer using a photolithography process and chemical mechanical polishing (CMP). In this case, the first conductive layer 120 is formed to have a square sectional shape having four corners instead of a shape having three corners (and a fourth rounded corner) as shown in FIG. 6A.

The first conductive layer 120 may be formed of doped polysilicon or metal. To form the first conductive layer 120 using doped polysilicon, an undoped polysilicon may be deposited first and then doped with impurity ions, or an already doped polysilicon layer may be deposited.

Figure 7A:
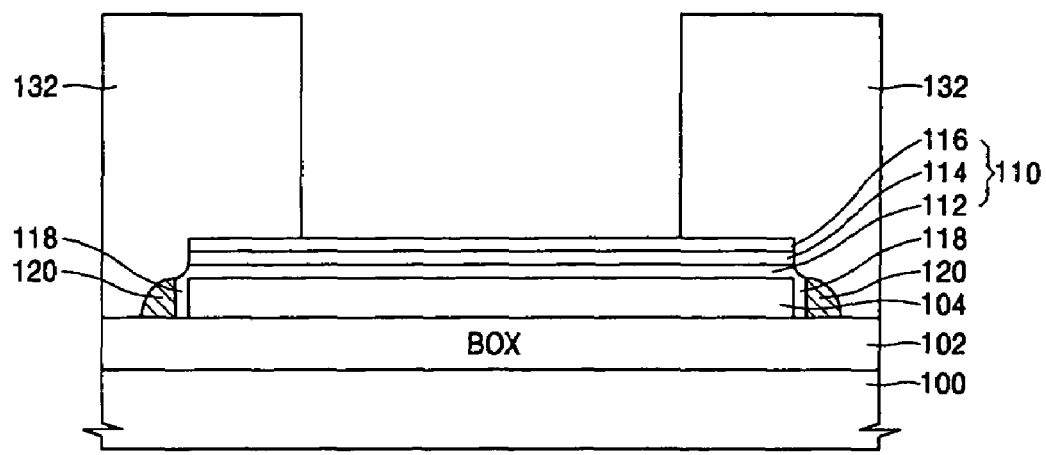
Figure 7B:
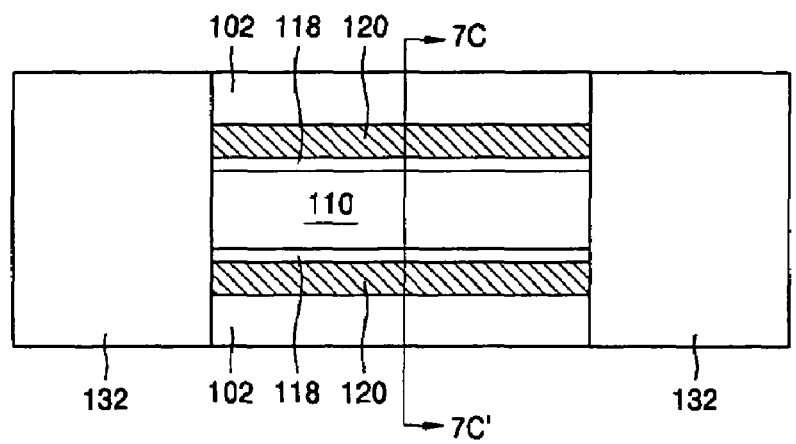
Figure 7C:
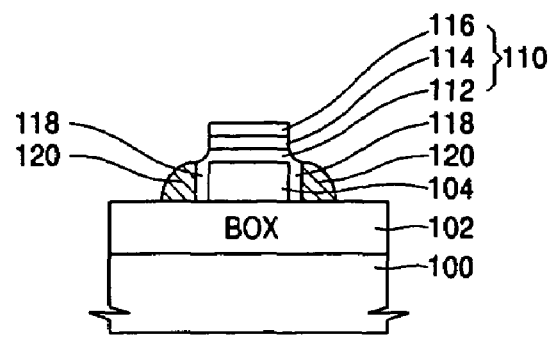

Referring to FIGS, 7A, 7B, and 7C, which is a sectional view taken along line 7C-7C' of FIG. 7B, a silicon nitride layer having a thickness of about 1000 Å is formed on the BOX 102 to cover the resultant structure where the first conductive layer 120 is formed. Thereafter, the silicon nitride layer is patterned using a photolithography process so as to expose the first conductive layer 120 in a central portion of the silicon island 104, i.e., a region where two floating gates and a source will be formed. Thus, a first protecting insulating pattern 132 is formed to protect a portion of the first conductive layer 120.

Figure 8A:
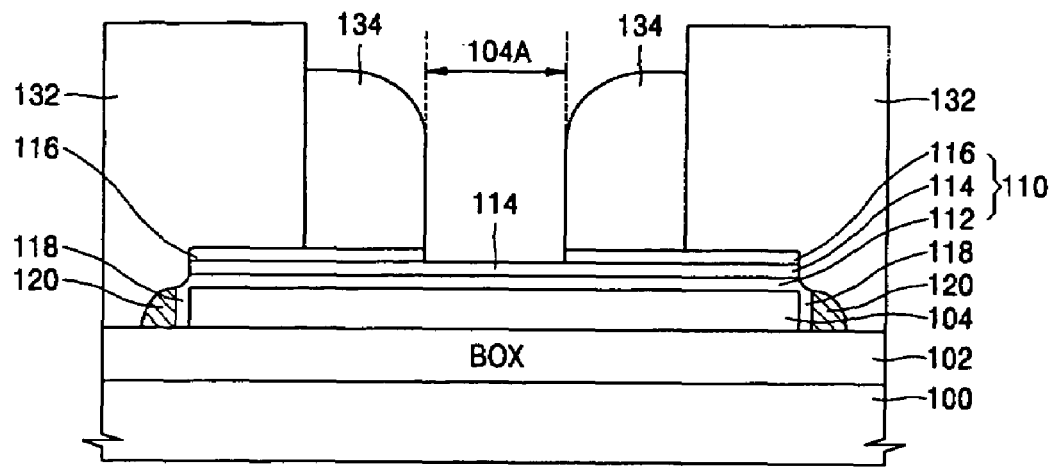
Figure 8B:
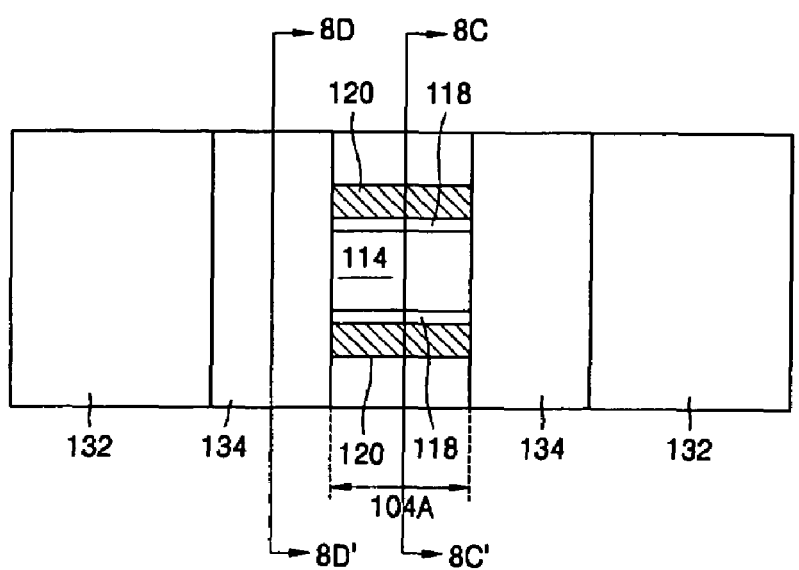

Referring to FIGS. 8A and 8B, a silicon oxide layer is formed to a thickness of about 1000 Å on the entire surface of the resultant structure where the first protecting insulating pattern 132 is formed. Thereafter, the silicon oxide layer is anisotropically etched again to form a second protecting insulating pattern 134 on the sidewalls of the first protecting insulating pattern 132 in the shape of spacers. While the silicon oxide layer is being anisotropically etched to form the second protecting insulating pattern 134, the oxide layer 116 constituting an uppermost portion of the mask pattern 110 is also etched. This exposes the nitride layer 114 of the mask pattern 110 in a first region 104A, where a source will be formed inside the active region formed of the silicon island 104. The second protecting insulating pattern 134 covers and protects a portion of the first conductive layer 120, where floating gates will be formed. Also, the first conductive layer 120, which surrounds the silicon island 104, is exposed between the two adjacent second protecting insulating patterns 134.

Figure 8C:
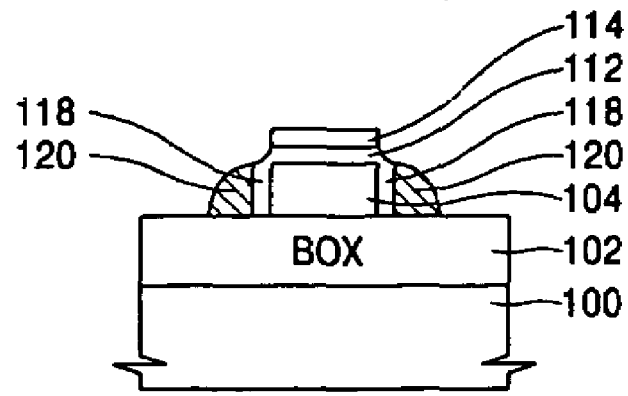
Figure 8D:
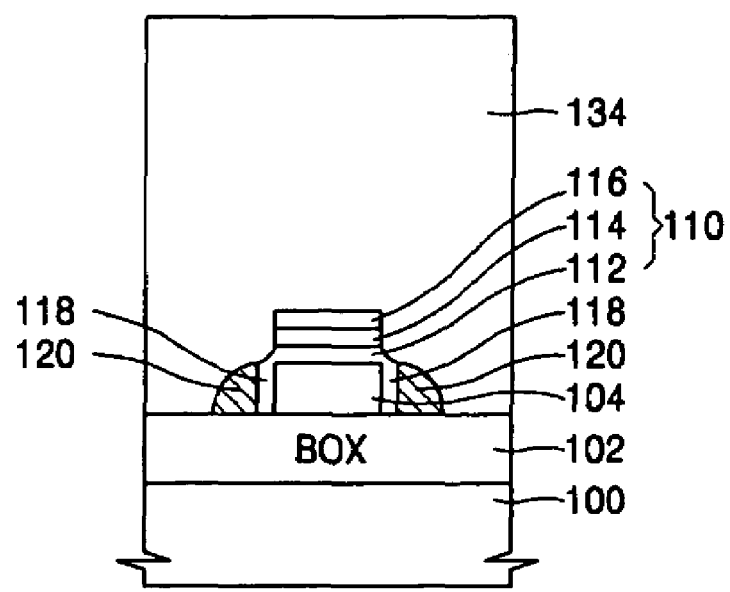

FIGS. 8C and 8D are sectional views taken along lines 8C-8C' and 8D-8D', respectively, of FIG. 8B.

Figure 9A:
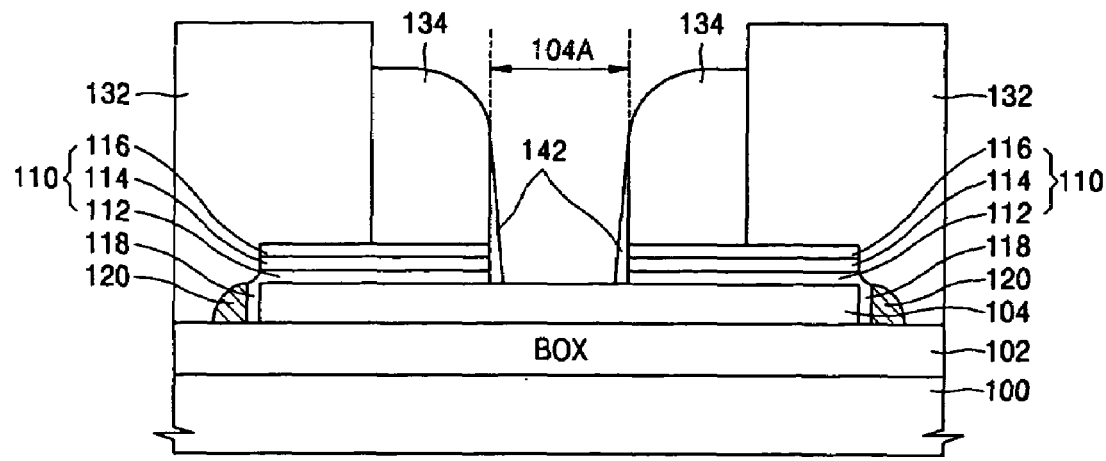
Figure 9B:
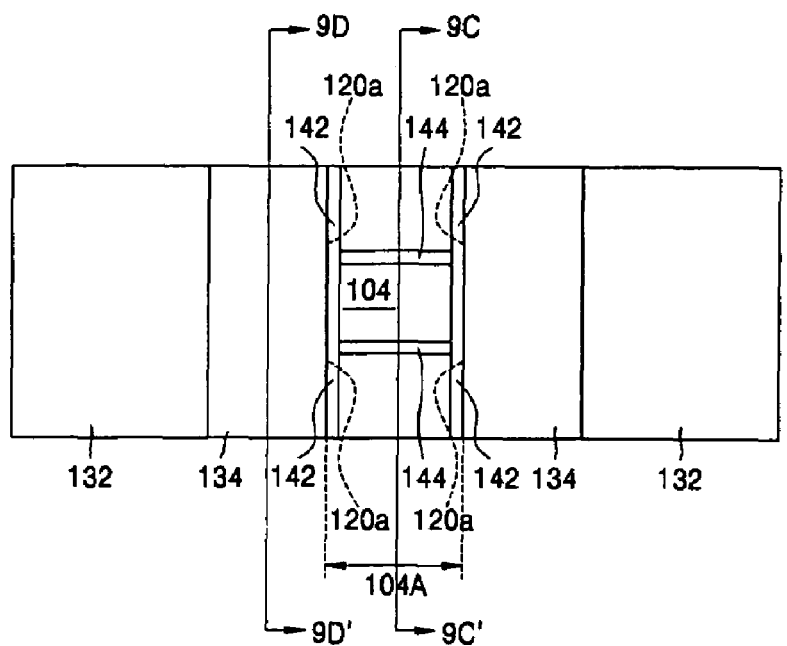

Referring to FIGS. 9A and 9B, a portion of the first conductive layer 120, which covers the sidewalls of the silicon island 104 in the first region 104A, is selectively removed by using the first protecting insulating pattern 132 and the second protecting insulating pattern 134 as an etch mask. As a result, first exposed sidewalls 120a are formed adjacent to the first region 104A on the first conductive layer 120, and the first oxide layer 118 covering the sidewalls of the silicon island 104 is exposed in the first region 104A.

Thereafter, the nitride layer 114, which is exposed on the silicon island 104, is removed in the first region 104A to expose the oxide layer 112 of the mask pattern 110 in the first region 104A. Then, the first exposed sidewalls 120a disposed on the first conductive layer 120 are oxidized by thermal oxidation. A second oxide layer is formed by CVD on the resultant structure and then anisotropically etched again. This forms first insulating spacers 142 to cover the first exposed sidewalls 120a disposed on the first conductive layer 120. The thermal oxidation, for oxidizing the first exposed sidewalls 120a, may be optionally omitted. Concurrently with the formation of the insulating spacers 142, spacers 144 are formed to cover the both sidewalls of the silicon island 104 in the first region 104A. The oxide layer 112 disposed on the silicon island 104 in the first region 104A is removed to expose the top surface of the silicon island 104. A source contact will be formed on the exposed top surface of the silicon island 104 later. If necessary, the etching of the second oxide layer may be further performed to expose the both sidewalls of the silicon island 104, such that even the spacers 144 covering the both sidewalls of the silicon island 104 are removed in the first region 104A.

Figure 9C:
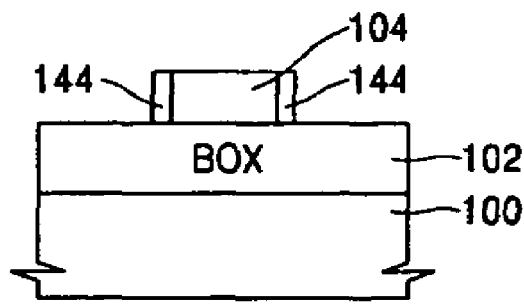
Figure 9D:
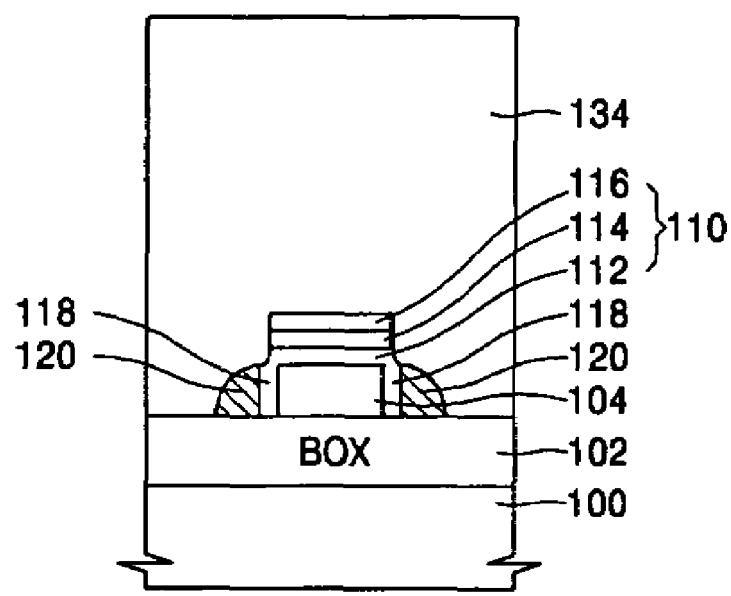

FIGS. 9C and 9D are sectional views taken along lines 9C-9C' and 9D-9D', respectively, of FIG. 9B.

Figure 10A:
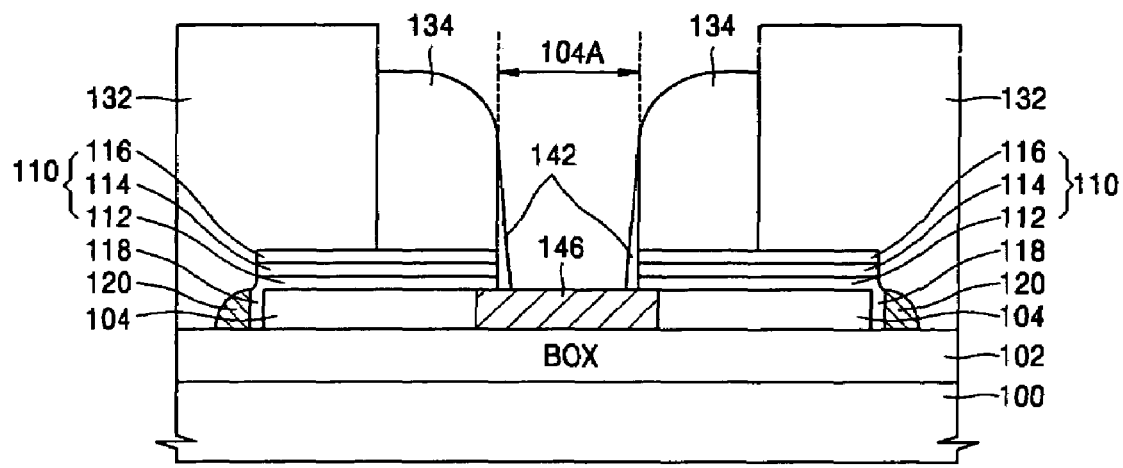
Figure 10B:
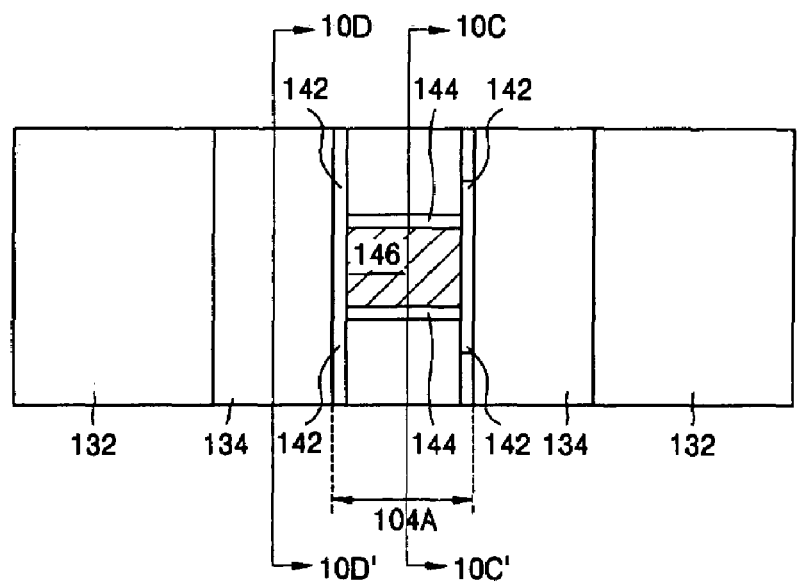

Referring to FIGS. 10A and 10B, impurity ions are implanted into the entire surface of the resultant structure to form a source 146 in the first region 104A of the silicon island 104. To form the source 146, impurity ions of a second conductivity type, which is opposite to the first conductivity type, e.g., n-type impurity ions, are implanted at a high concentration. The impurity ions for the source 146 are implanted at a higher concentration than that of the impurity ions for the channel ion implantation.

Figure 10C:
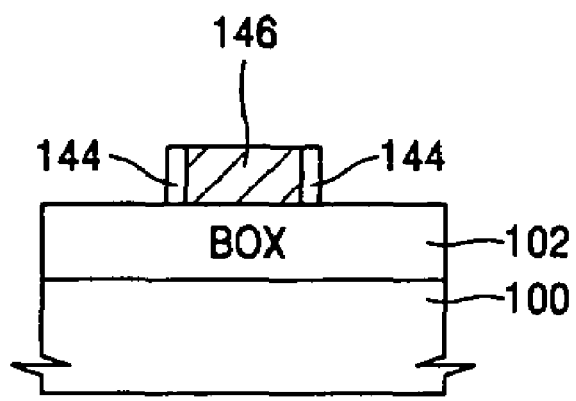
Figure 10D:
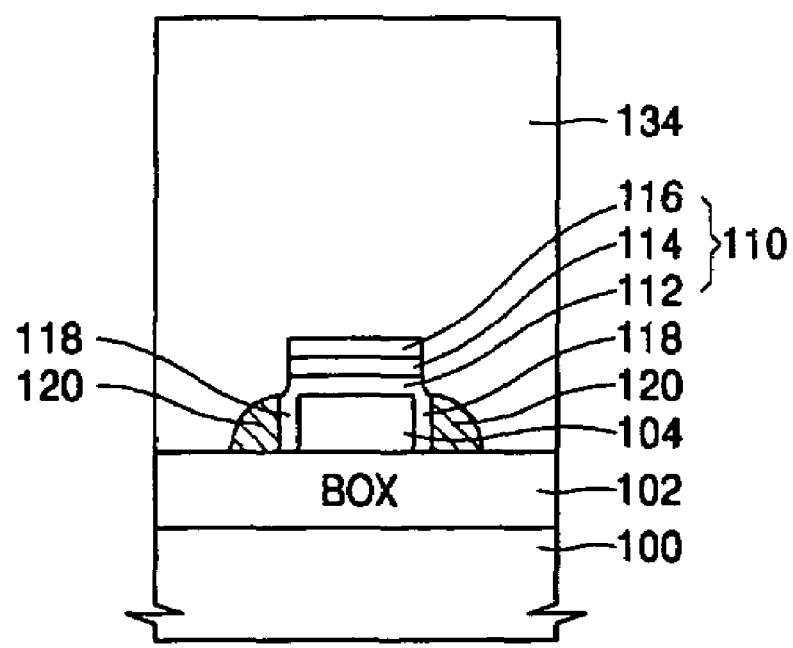

FIGS. 10C and 10D are sectional views taken along lines 10C-10C' and 10D-10D', respectively, of FIG. 10B.

Figure 11A:
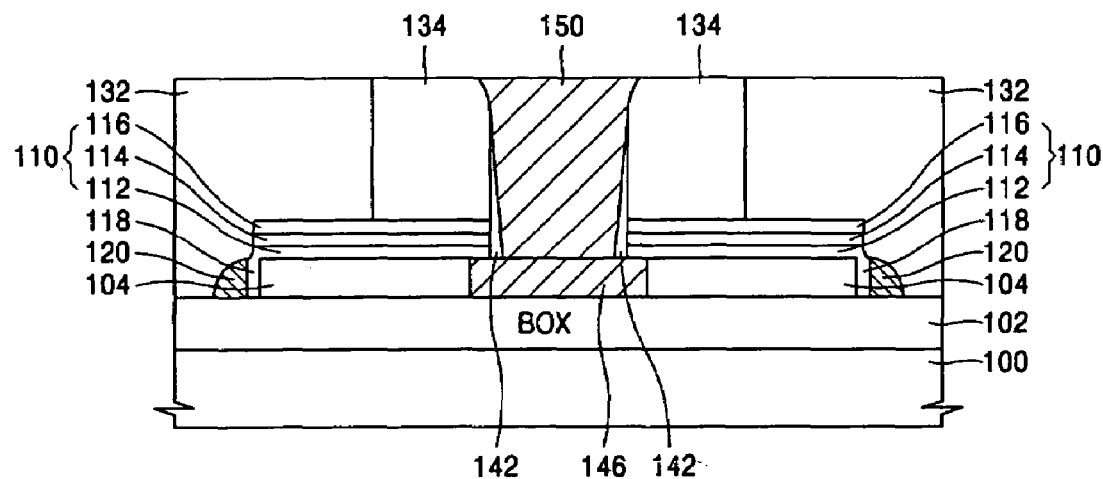
Figure 11B:
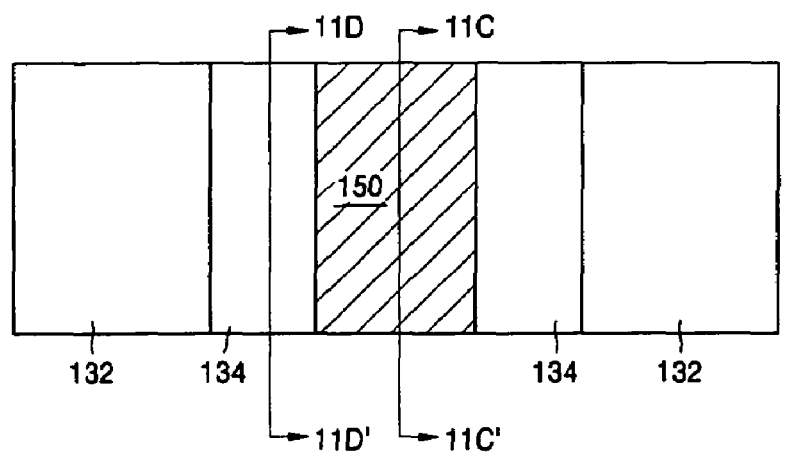

Referring to FIGS. 11A and 11B, a conductive material is deposited on the entire surface of the resultant structure where the source 146 is formed. Thus, a second conductive layer is formed to a thickness of about 3000 Å to completely fill a space between the two adjacent second protecting insulating patterns 134 in the first region 104A. The second conductive layer is then planarized using CMP to form a source line 150 connected to the source 146. The source line 150 extends in a second direction, i.e., in the y direction, perpendicular to the first direction.

After the CMP process is performed, the first protecting insulating pattern 132 and the second protecting insulating pattern 134, which are adjacent to the source line 150, have a slightly reduced height. The source line 150 forms an ohmic contact with the source 146. The second conductive layer, which is used to form the source line 150, may be formed of doped polysilicon or metal. To form the source line 150 using doped polysilicon, an undoped polysilicon layer may be deposited and then doped with impurity ions, or an already doped polysilicon layer may be deposited.

Figure 11C:
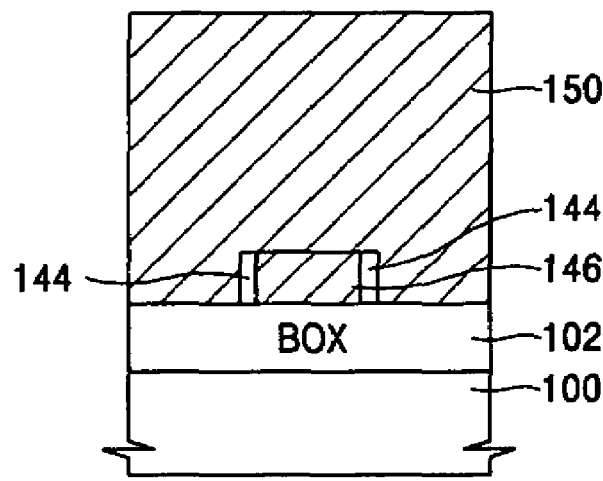
Figure 11D:
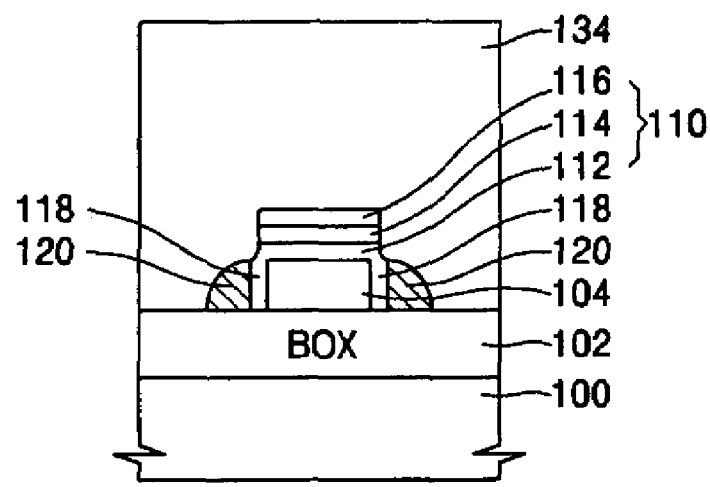

FIGS. 11C and 11D are sectional views taken along lines 11C-11C' and 11D-11D', respectively, of FIG. 11B.

Figure 12A:
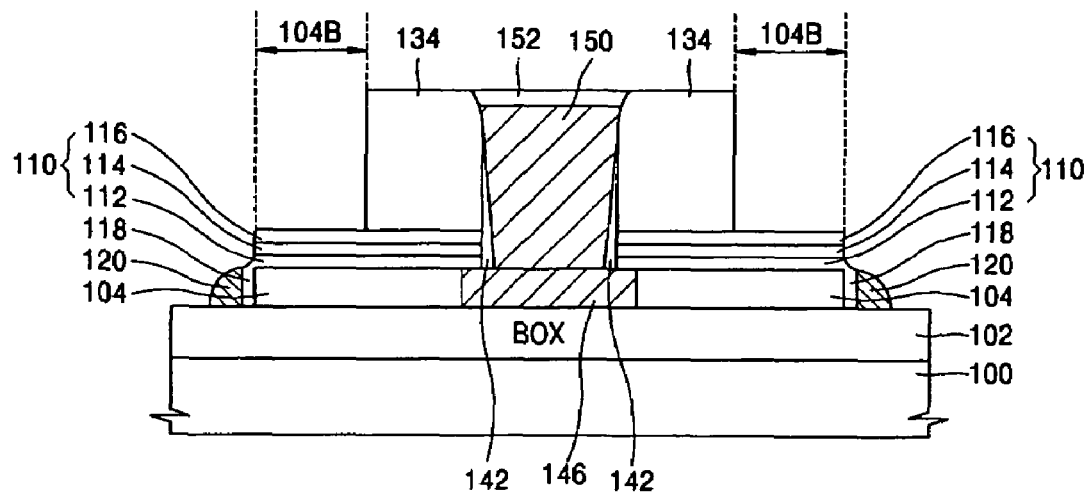
Figure 12B:
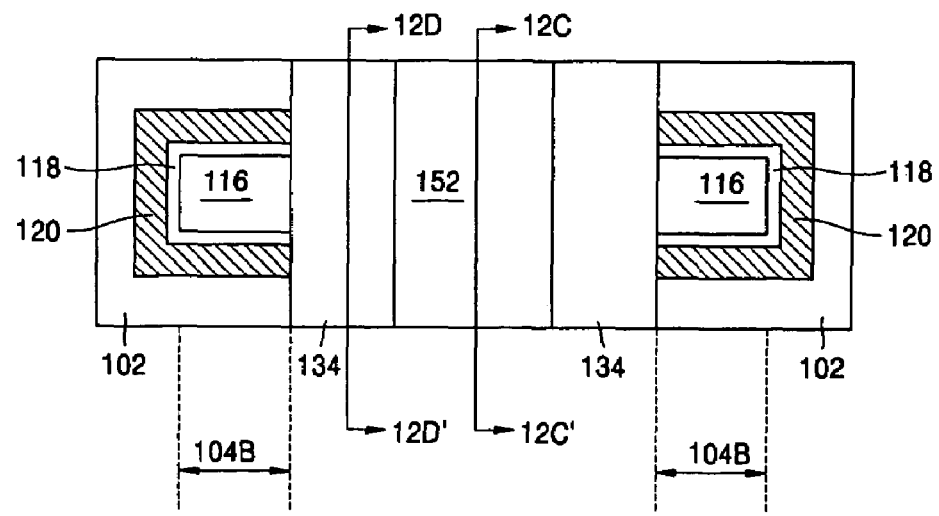

Referring to FIGS. 12A and 12B, the top surface of the source line 150 is thermally oxidized to form a thermal oxide layer 152 having a thickness of about 100 Å. Then, the first protecting insulating pattern 132, which is formed of the silicon nitride layer, is wet or dry etched and removed by using the thermal oxide layer 152 and the second protecting insulating pattern 134 as an etch mask. As a result, the oxide layer 116 of the mask pattern 110, which covers the top surface of the silicon island 104, is exposed in a second region 104B of the silicon island 104, and portions of the first conductive layer 120 and the BOX 102.

Figure 12C:
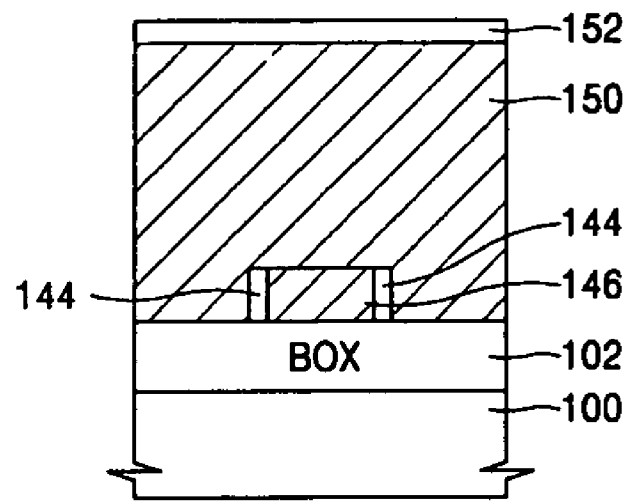
Figure 12D:
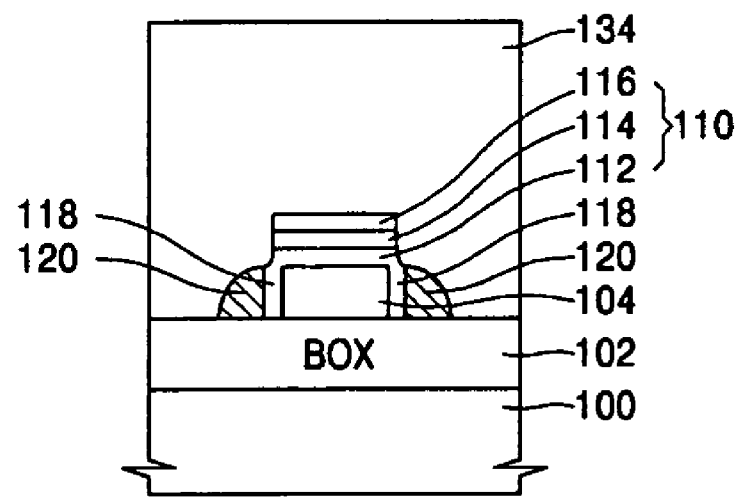

FIGS. 12C and 12D are sectional views taken along lines 12C-12C' and 12D-12D', respectively, of FIG. 12B.

Figure 13A:
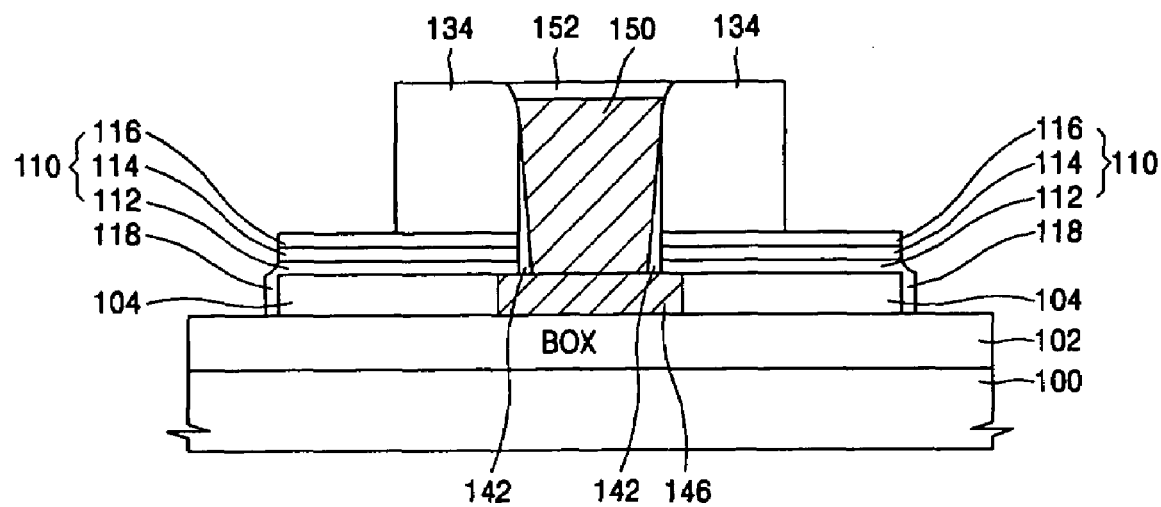
Figure 13B:
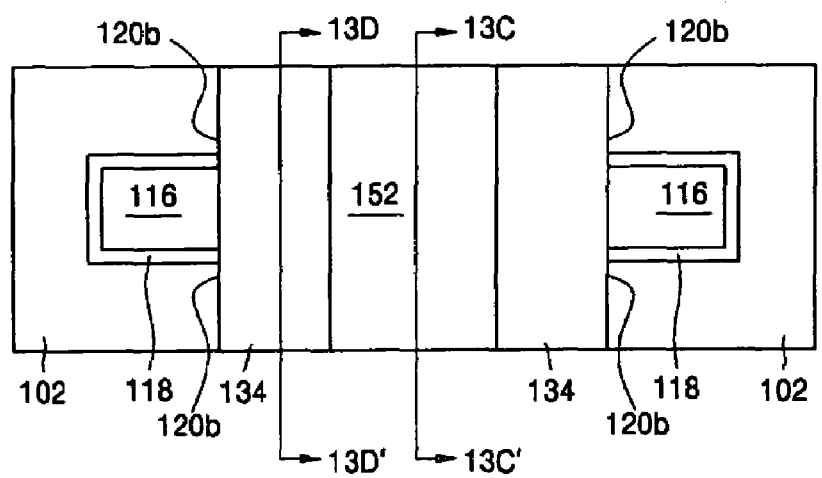

Referring to FIGS. 13A and 13B, a portion of the first conductive layer 120, which covers the second region 104B of the silicon island 104, is selectively removed by a dry or wet etching process using oxide layers exposed on the silicon substrate 100, i.e., the thermal oxide layer 152, the second protecting insulating pattern 134, the oxide layer 116, the first oxide layer 118, and the BOX 102 as a hard mask. As a result, a first floating gate 122 and a second floating gate 124, which are formed of the remaining portion of the first conductive layer 120, are formed under the second protecting insulating pattern 134. The first floating gate 122 and the second floating gate 124 face each other with the silicon island 104 disposed therebetween. By removing the exposed first conductive layer 120, second exposed sidewalls 120b are formed adjacent to the second region 104B on the remaining first conductive layer 120, i.e., the first and second floating gates 122 and 124. The second protecting insulating pattern 134 protects a portion of the first conductive layer 120, which remains adjacent the silicon island 104 excluding the first region 104A and the second region 104B.

Figure 13C:
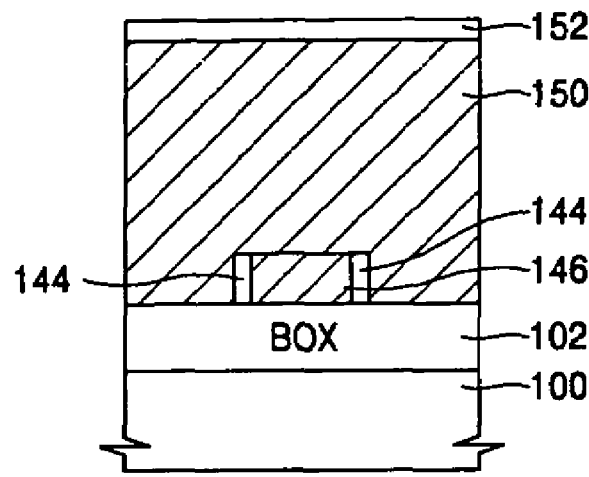
Figure 13D:
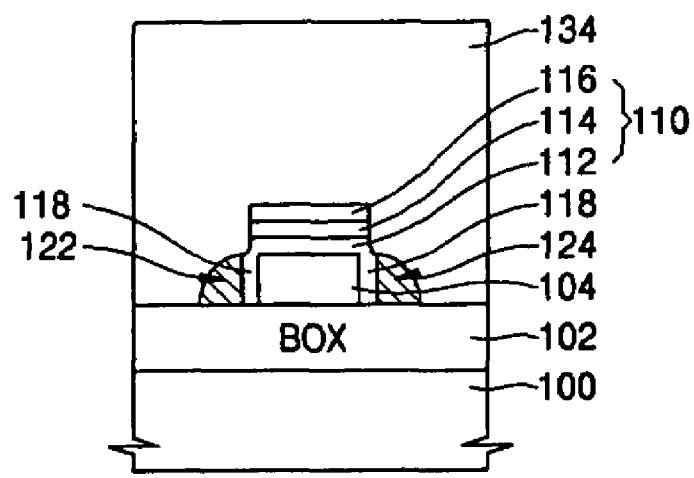

FIGS. 13C and 13D are sectional views taken along lines 13C-13C' and 13D-13D', respectively, of FIG. 13B.

Figure 14A:
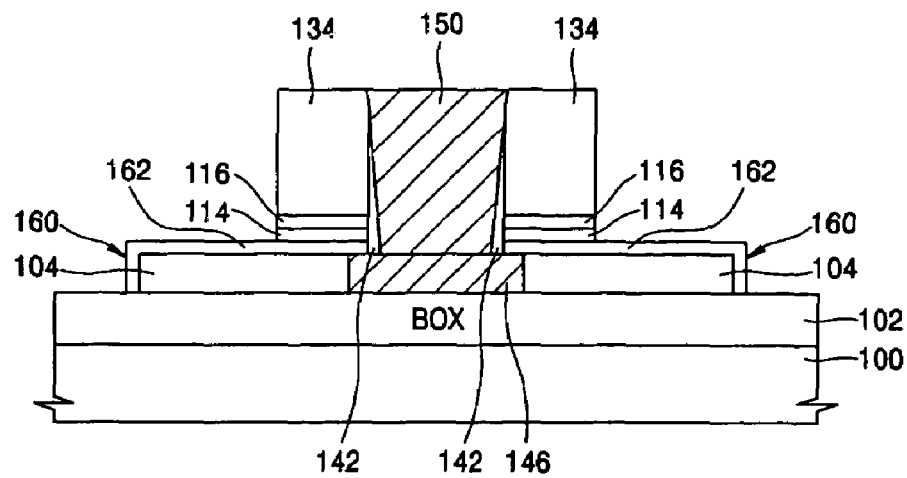
Figure 14B:
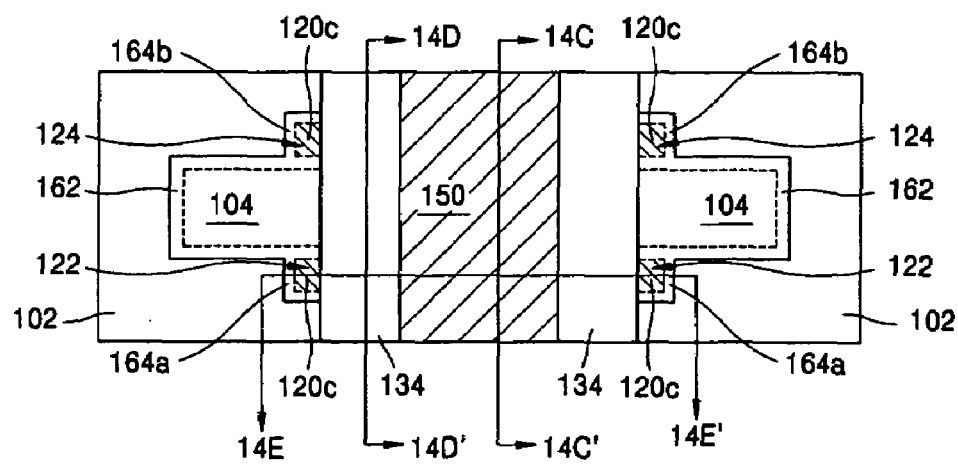

Referring to FIGS. 14A and 14B, the thermal oxide layer 152 and the oxide layer 116 of the mask pattern 110 are wet etched and removed to expose the nitride layer 114 of the mask pattern 110. Next, the exposed nitride layer 114 is wet etched and removed to expose the oxide layer 112 of the mask pattern 110. Thereafter, the oxide layer 112 of the mask pattern 110 is wet etched and removed to expose the top surface of the silicon island 104 in the second region 104B.

After the thermal oxide layer 152 and the oxide layers 116 and 112 are removed, the second protecting insulating pattern 134 has reduced height and width. Thus, as illustrated with dotted lines in FIG. 14B, a portion of the top surfaces of the first and second floating gates 122 and 124, which is covered with the second protecting insulating pattern 134, is exposed by a predetermined width adjacent to the second protecting insulating pattern 134. That is, while the top surface of the silicon island 104 is being exposed in the second region 104B, the top surface 120b of the first and second floating gates 122 and 124 and the corners of the second exposed sidewalls 120b are exposed.

A third oxide layer 160 is formed on the exposed top surface of the silicon island 104, the second exposed sidewalls 120b and the exposed top surface 120c of the first conductive layer 120 by using thermal oxidation or a CVD process. As a result, an insulating layer 162 is formed on the silicon island 104, and second insulating spacers 164a and 164b are formed on the second exposed sidewalls 120b and the exposed top surface 120c of the first conductive layer 120, which constitutes the first and second floating gates 122 and 124. The insulating layer 162 and the insulating spacers 164a and 164b are formed of the third oxide layer 160. The third oxide layer 160 may be formed to a thickness of about 160 Å to 170 Å, using thermal oxidation, a CVD process, or a combination thereof.

In the present invention, the insulating layer 162 and the second insulating spacers 164a and 164b are concurrently formed. The second insulating spacers 164a and 164b are formed to cover the corners of the first floating gate 122 and the second floating gate 124, respectively. Also, the second insulating spacers 164a and 164b function as a first interpoly tunneling insulating layer 164a and a second interpoly tunneling insulating layer 164b between the first floating gate 122 and a word line, which will be formed later, and between the second floating gate 124 and the word line. In the present invention, the same reference numerals are used to denote the second insulating spacers and the first and second interpoly tunneling insulating layers.

Here, it is described that the second insulating spacers 164a and 164b are formed on not only the second exposed sidewalls 120b of the first conductive layer 120 but also on the exposed surfaces 120c thereof, but the present invention is not limited thereto. That is, it is possible to control the areas of the exposed top surface 120c by varying the width of the second protecting insulating pattern 134, and it is also possible to form the second insulating spacers only on the second exposed sidewalls 120b without exposing the top surfaces of the first conductive layer 120. Preferably, as described with reference to FIG. 2, to surround the corners of the first and second floating gates 122 and 124 with the word line 60, the width of the second protecting insulating pattern 134 is reduced so as to expose a portion of the top surface of the first conductive layer 120.

Figure 14C:
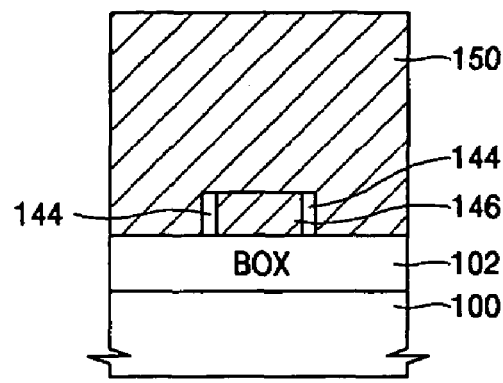
Figure 14D:
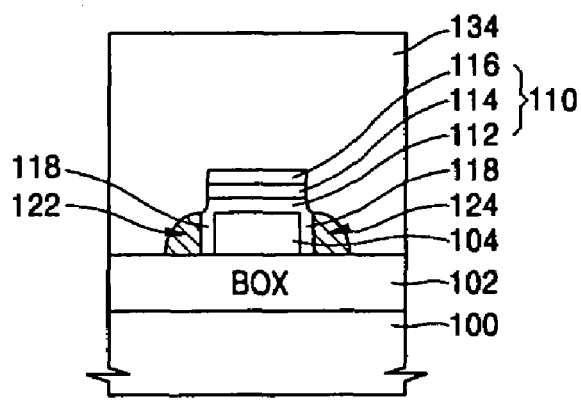
Figure 14E:
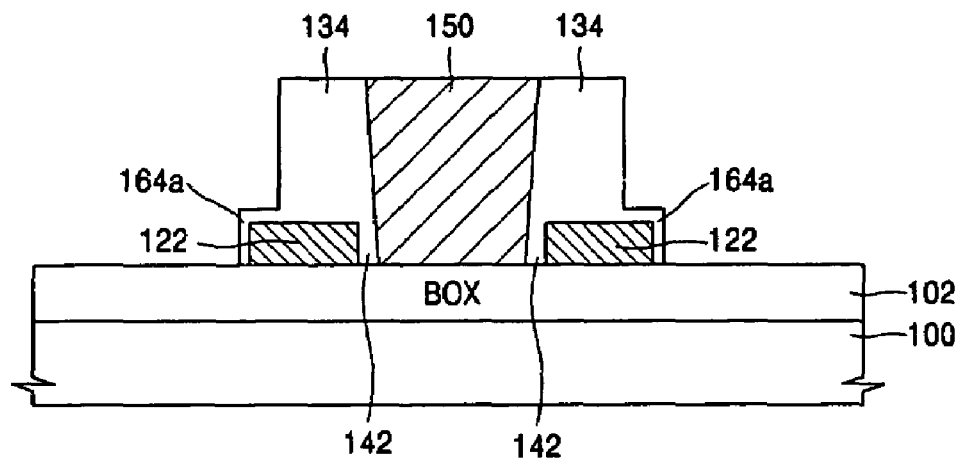

FIGS. 14C and 14D are sectional views taken along lines 14C-14C' and 14D-14D', respectively, of FIG. 14B, and FIG. 14E is a sectional view taken along line 14E-14E' of FIG. 14B.

Figure 15A:
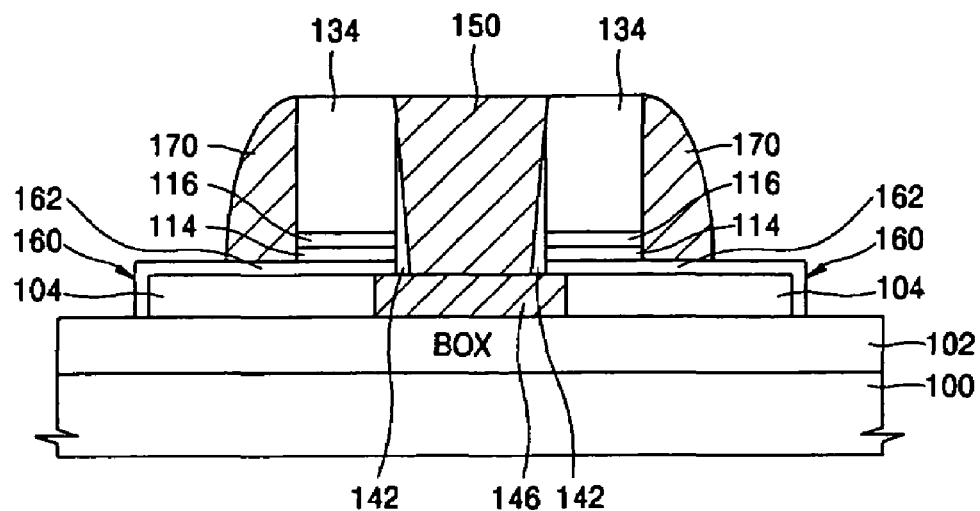
Figure 15B:
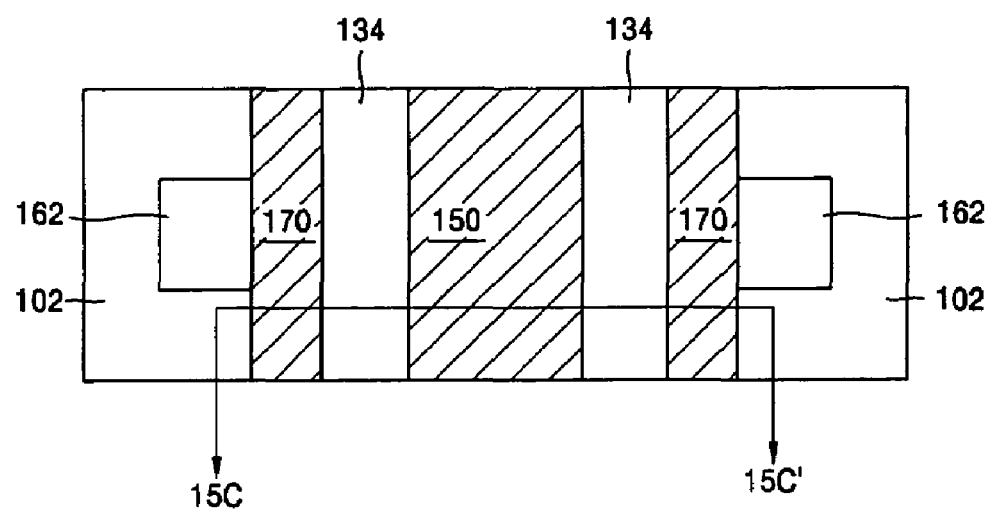

Referring to FIGS. 15A and 15B, a blanket deposit of a conductive material is deposited to a thickness of about 2000 Å using CVD to cover the sidewalls and the top surface of the second protecting insulating pattern 134. Thus, a third conductive layer is formed. Then, the third conductive layer is anisotropically etched until the third oxide layer 160 disposed on the silicon island 104 is exposed, thereby forming a word line 170 on the sidewalls of the second protecting insulating pattern 134. The word line 170 extends parallel to the source line 150, i.e., in the y direction of FIG. 1. The third conductive layer may be formed of doped polysilicon or metal. To form the third conductive layer using doped polysilicon, an undoped polysilicon layer may be deposited and then doped, or an already doped polysilicon layer may be deposited.

Figure 15C:
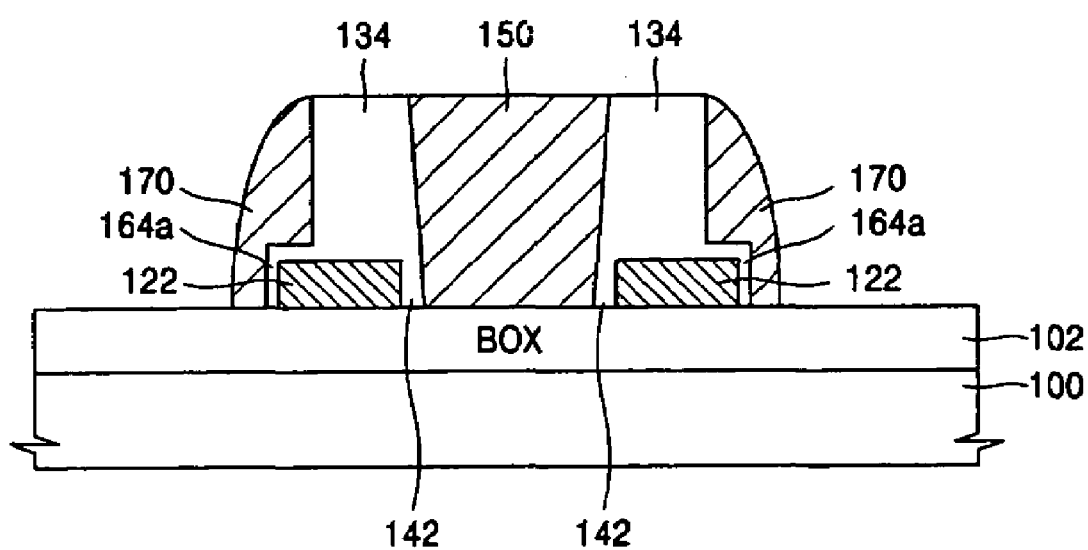

FIG. 15C is a sectional view taken along line 15C-15C' of FIG. 15B. In FIG. 15C, the three corners of the first floating gate 122 are surrounded by the word line 170 and separated from the word line 170 by the first interpoly tunneling insulating layer 164a, and the three corners of the second floating gate 124 are surrounded by the word line 170 and separated from the word line 170 by the second interpoly tunneling insulating layer 164b. Although only the first floating gate 122 and its peripheral region are shown in FIG. 15C, the second floating gate 124 has the same structure as the first floating gate 122 shown in FIG. 15C.

Figure 16A:
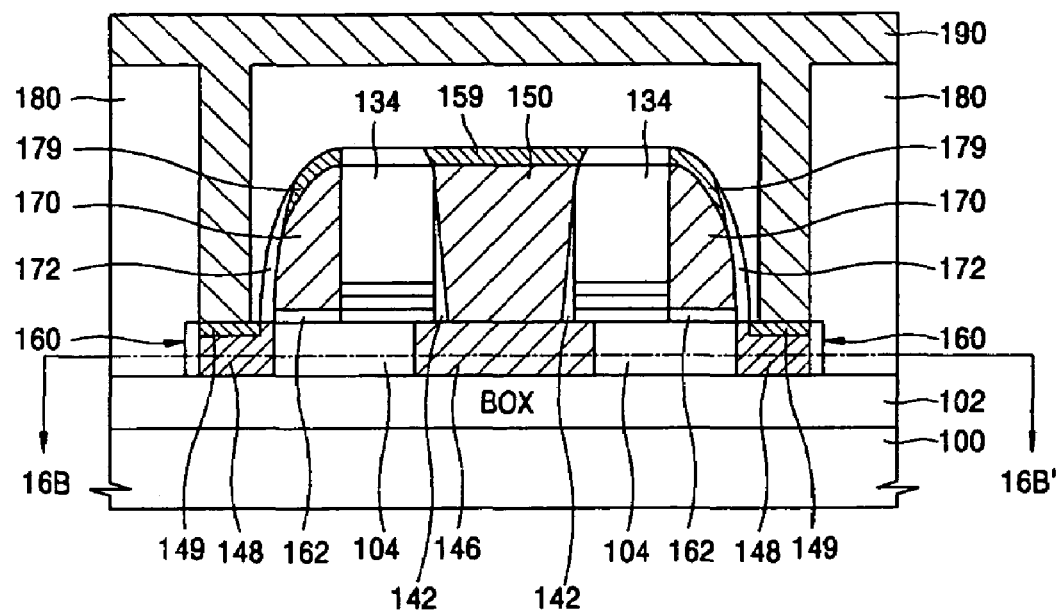
Figure 16B:
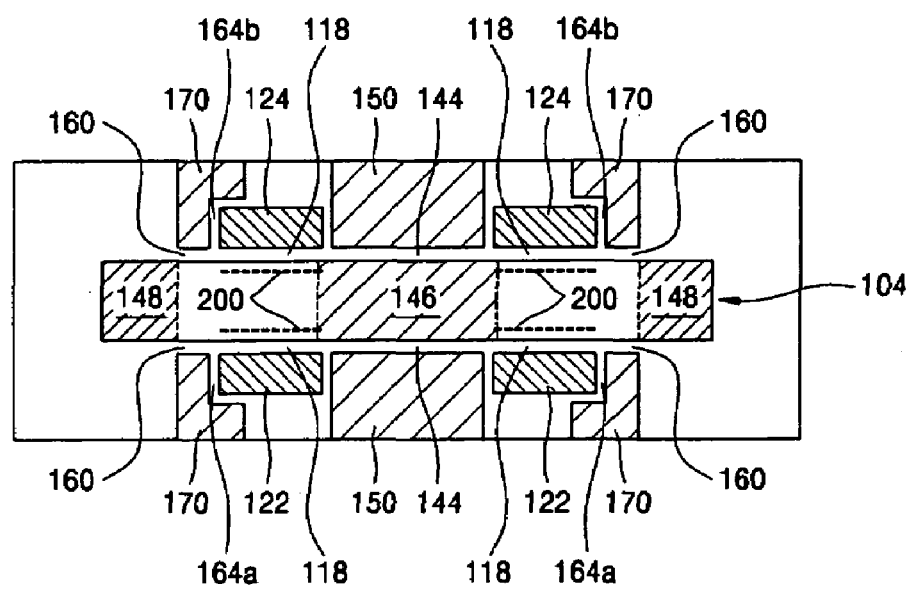
FIG. 16B is a partial sectional view of FIG. 16A.

Referring to FIG. 16A, a silicon nitride layer is deposited on the entire surface of the resultant structure where the word line 170 is formed, and etched back to form nitride spacers 172 covering the word line 170. During the etchback process for forming the nitride spacers 172, the third oxide layer 160, which covers the top surface of the silicon island 104, is removed due to over-etching. Thus, the top surface of the silicon island 104 is exposed adjacent to the nitride spacers 172. Thereafter, impurity ions are implanted into the exposed top surface of the silicon island 104 by a typical ion implantation process to form a drain 148 in the silicon island 104. To form the drain 148, impurity ions of the second conductivity type that is opposite to the first conductivity type, e.g., n-type impurity ions are implanted at a high concentration. The impurity ions are implanted into the drain 148 at a higher concentration than that of the impurity ions for the channel ion implantation.

Metal silicide layers 159,179, and 149 are formed on the source line 150, the word line 170, and the drain 148 by using typical salicide process, CVD process, or PVD process. The metal silicide layers 159, 179, and 149 can reduce sheet resistance and contact resistance at each contact. For example, if the source line 150 and the word line 170 are formed of doped polysilicon, to form the metal silicide layers 159,179, and 149, a metal layer is deposited by sputtering on the entire surface of the resultant structure where the drain 148 is formed, and then a primary thermal treatment is performed to form a metal silicide layer of a first phase. Next, the non-reacted metal layer is selectively removed by a wet etch process, and then a secondary thermal treatment is performed to form a metal silicide layer of a second phase, which is more stable in terms of resistance and phase than the metal silicide layer of the first phase. The metal silicide layers 159,179, and 149 may be formed of, for example, cobalt silicide, nickel silicide, titanium silicide, hafnium silicide, platinum silicide, or tungsten silicide.

An insulating material is deposited on the entire surface of the resultant structure where the metal silicide layers 159, 179, and 149 are formed, to form an interlayer dielectric (ILD) 180. A portion of the ILD 180 is etched by a photolithography process to form a contact hole, which exposes the drain 148 of each memory cell. Thereafter, a fourth conductive layer is formed on the ILD 180 to a sufficient thickness enough to fill the contact hole, and then patterned by a photolithography process to form a bit line 190. The fourth conductive layer may be formed of doped polysilicon or metal. To form the fourth conductive layer using doped polysilicon, an undoped polysilicon layer may be deposited first and then doped, or an already doped polysilicon layer may be deposited.

FIG. 16B is a partial sectional view taken along line 16B-16B' of FIG. 16A.

As shown in FIG. 16B, in the nonvolatile semiconductor memory device of the present invention, a first floating gate and a second floating gate face each other with the silicon island 104 therebetween, and the first and second floating gates are electrically insulated from each other. The first coupling gate insulating layer and the second coupling gate insulating layer, each of which is formed of the second oxide layer 118, are interposed between the channel region of the silicon island 104 and the first floating gate 122 and between the channel region of the silicon island 104 and the second floating gate 124, respectively. The word line 170 extends adjacent to the first floating gate 122 and the second floating gate 124. The first interpoly tunneling insulating layer 164a is interposed between the first floating gate 122 and the word line 170, and the second interpoly tunneling insulating layer 164b is interposed between the second floating gate 124 and the word line 170.

When voltages are applied to the word line 170 and the source 146, two channels 200 are formed along both sidewalls of the silicon island 104 perpendicular to a main surface of the SOI substrate and adjacent to the first coupling gate insulating layer and the second coupling gate insulating layer (each of which is formed of the first oxide layer 118). That is, a non-planar nonvolatile semiconductor memory device, in which the two channels 200 are formed perpendicular to the main surface of the SOI substrate, is provided.

The nonvolatile semiconductor memory device of the present invention is a non-planar split-gate-type device disposed on the SOI substrate. Each memory cell includes two floating gates, which face each other with the active region, i.e., the silicon island disposed therebetween . Accordingly, each floating gate has at least three corners, which are adjacent to a control gate and on which an electric field concentrates. In other words, since each memory cell includes a total of six or more corners of the floating gates adjacent to the control gate, the areas of the floating gates, where the electric field concentrates, increase.

Also, the device of the present invention comprises a double-floating gate structure. Both sidewalls of the active region serve as channels such that the channels are formed perpendicular to the main surface of the substrate. This improves the integration density as compared with conventional devices. Also, since the effective channel width for each memory cell can increase in a given layout, a large current can be held in the memory cell.

Further, the device of the present invention has a full depletion mode SOI structure, thus improving a sub-threshold characteristic. The non-planar structure, including double floating gates, is provided such that a gate is easily controlled so as to suppress the SCE and improve drain induced barrier lowering (DIBL). As a result, the scaling effect of the memory device can be enhanced. The SOI structure allows complete isolation between devices and excellent radiation hardness, thus reducing soft errors.

While the present invention has been particularly shown and described with reference to preferred embodiments thereof, it will be understood by those of ordinary skill in the art that various changes in form and details may be made therein without departing from the spirit and scope of the present invention as defined by the following claims.

What is claimed is:

1. A nonvolatile semiconductor memory device comprising:
   a memory cell array including a plurality of memory cells, each memory cell defined by having a contact point with a bit line and a contact point with a word line, each memory cell formed on a substrate, and each memory cell including,
   two floating gates disposed inside the memory cell, each floating gate having a plurality of corners; and
   an active region interposed between the two floating gates, wherein the word line overlaps four corners of each floating gate.

2. The device of claim 1, wherein the two floating gates are electrically insulated from each other.

3. The device of claim 1, wherein the active region provides for forming two channels, which are respectively disposed adjacent to the two floating gates.

4. The device of claim 3, wherein the two channels are formed along side surfaces of the active region, which are perpendicular to an upper surface of the substrate.

5. The device of claim 1, wherein the active region extends over the substrate and has a square sectional bar shape.

6. The device of claim 5, wherein the active region extends in a first direction over the substrate, and the word line extends in a second direction perpendicular to the first direction.

7. The device of claim 1, wherein at least a top surface of each of the floating gates is overlapped by the word line.

8. The device of claim 1, further comprising:
 a source line extending over the active region of each memory cell parallel to the word line.

9. The device of claim 8, wherein at least two memory cells share a same source line.

10. The device of claim 1, wherein the active region is formed of silicon on an insulator layer.

* * * * *